United States Patent
Lee et al.

(10) Patent No.: US 8,529,776 B2
(45) Date of Patent: Sep. 10, 2013

(54) HIGH LATERAL TO VERTICAL RATIO ETCH PROCESS FOR DEVICE MANUFACTURING

(75) Inventors: Kyeong Tae Lee, Los Gatos, CA (US); Sang Wook Kim, Palo Alto, CA (US); Daehee Weon, Cupertino, CA (US); Sang-jun Choi, Santa Clara, CA (US); Sreekar Bhaviripudi, Sunnyvale, CA (US); Jahyong Kuh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 63 days.

(21) Appl. No.: 13/190,378

(22) Filed: Jul. 25, 2011

(65) Prior Publication Data
US 2013/0029490 A1   Jan. 31, 2013

(51) Int. Cl.
*C03C 15/00* (2006.01)

(52) U.S. Cl.
USPC ............. 216/41; 438/570; 438/583; 438/706; 438/710; 438/737

(58) Field of Classification Search
USPC ................. 438/706, 710, 570, 583, 737, 738; 216/41
See application file for complete search history.

(56) References Cited

U.S. PATENT DOCUMENTS

| | | | |
|---|---|---|---|
| 6,339,028 B2 * | 1/2002 | Tesauro | 438/708 |
| 7,172,969 B2 * | 2/2007 | Xia et al. | 438/689 |
| 7,442,606 B2 * | 10/2008 | Lee | 438/257 |
| 7,786,020 B1 | 8/2010 | Kang et al. | |
| 2008/0182419 A1 * | 7/2008 | Yasui et al. | 438/710 |

OTHER PUBLICATIONS

Kim, et al., "Multi-Layered Vertical Gate NAND Flash Overcoming Stacking Limit for Terabit Density Storage," 2009, pp. 188-189, Symposium on VLSI Technology Digest of Technical Papers.
Maeda, Takashi, et al., "Multi-stacked 1G cell/layer Pipe-shaped BiCS Flash Memory," 2009, pp. 22-23, Symposium on VLSI Circuits Digest of Technical Papers.
Tanaka, H., et al., "Bit Cost Scalable Technology with Punch and Plug Process for Ultra High Density Flash Memory," 2007, pp. 14-15, Symposium on VLSI Technology Digest of Technical Papers.

* cited by examiner

*Primary Examiner* — Nadine Norton
*Assistant Examiner* — Maki Angadi
(74) *Attorney, Agent, or Firm* — Blakely Sokoloff Taylor & Zaffman LLP

(57) ABSTRACT

A layer stack over a substrate is etched using a photoresist pattern deposited on the layer stack as a first mask. The photoresist pattern is in-situ cured using plasma. At least a portion of the photoresist pattern can be modified by curing. In one embodiment, silicon by-products are formed on the photoresist pattern from the plasma. In another embodiment, a carbon from the plasma is embedded into the photoresist pattern. In yet another embodiment, the plasma produces an ultraviolet light to cure the photoresist pattern. The cured photoresist pattern is slimmed. The layer stack is etched using the slimmed photoresist pattern as a second mask.

14 Claims, 9 Drawing Sheets

HIGH LATERAL TO VERTICAL RATIO ETCH PROCESS FOR DEVICE MANUFACTURING

BACKGROUND

1. Field

Embodiments of the present invention pertain to the field of electronic device manufacturing, and in particular, to wafer etching.

2. Description of Related Art

In electronic device manufacturing, electronic devices are formed on a wafer. Typically, layers of various semiconducting, conducting and insulating materials are utilized to form the integrated circuits. These materials may be doped, deposited and etched to form electronic devices.

Decreasing the dimensions of electronic devices and increasing the level of their integration are two of the major trends n the current electronic device manufacturing. As a result of these trends, the density of elements forming a semiconductor device continuously increases. The shrinkage of the semiconductor devices down to submicron dimensions requires that the routine fabrication of their elements also be performed on the submicron level. In addition, to increase the level of the device integration, structures forming electronic devices may be stacked on top of each other.

Typically, an electronic device is fabricated using many layers of films. Each of these layers may be created using a mask that dictates the pattern of the layer. The accuracy of this pattern is extremely critical in manufacturing the chip.

As a line width of a circuit of the electronic device becomes narrower, and a wavelength of a light source for the exposure of the photoresist is shortened, it becomes more difficult to obtain a desired width of the photoresist to form a device feature.

Generally, plasma etching may be used to fabricate integrated circuits. It typically involves a high-speed stream of glow discharge (plasma) of an appropriate gas mixture being shot at wafer. Typically, in plasma etching a vertical etching rate is substantially greater than a lateral etching rate. As a result, reducing the photoresist in lateral dimension to achieve a desired width of the photoresist may not be performed successfully. Furthermore, a line edge roughness (LER) can be generated by a structure of the resist that affects subsequent processes, for example an etching process, and, negatively influences electrical properties of the electronic device.

SUMMARY

Methods and apparatuses to perform high lateral to vertical ("L/V") ratio etching for electronic device manufacturing are described. A layer stack over a substrate is etched using a photoresist pattern deposited on the layer stack as a first mask. The photoresist pattern is in-situ cured using plasma. At least a portion of the photoresist pattern can be chemically modified by curing. In at least some embodiments, a crust layer formed on a top portion of the photoresist pattern is hardened by in-situ plasma curing. In one embodiment, silicon by-products are formed on the photoresist pattern from the plasma to harden the crust layer. In another embodiment, a carbon from the plasma is embedded into the PR pattern to harden the crust layer. In yet another embodiment, the plasma produces an ultraviolet ("UV") light to chemically modify and harden the photoresist pattern. The cured photoresist pattern is slimmed. The layer stack is etched using the slimmed photoresist pattern as a second mask.

In at least some embodiments, curing of the photoresist pattern is performed during etching of the layer stack. In at least some other embodiments, curing of the photoresist pattern and etching of the layer stack alternate. In at least one embodiment, the layer stack is a part of a multi-stacked structure on the substrate. In one embodiment, etching using the first mask, curing, slimming, and etching using the second mask are repeated until the substrate is exposed. In one embodiment, a layer stack comprises an insulating layer deposited on a conducting layer. In one embodiment, a layer stack comprises an oxide layer on a nitride layer. In one embodiment, a layer stack comprises a first polymer layer on a second polymer layer.

In at least some embodiments, a plasma etch chamber has an inlet to input a gas to generate plasma; and at least one power source coupled to the plasma etch chamber. The plasma etch chamber is configured to etch a layer stack over a substrate using a photoresist pattern deposited on the layer stack as a first mask. The plasma etch chamber is further configured to in situ cure the photoresist pattern. The plasma etch chamber is further configured to slim the cured photoresist pattern. The plasma etch chamber is he configured to etch the layer stack using the slimmed photoresist pattern as a second mask.

The plasma etch chamber can be configured to chemically modify at least a portion of the photoresist pattern. For example, a plasma etch chamber can be configured to form silicon by-products from the plasma on the photoresist pattern. For example, a plasma etch chamber can be configured to embed a carbon from the plasma into the photoresist pattern. As another example, a plasma etch chamber can be configured to cause the plasma to produce an ultraviolet light to cure the photoresist pattern.

In at least some embodiments, the plasma etch chamber is configured to cure the photoresist pattern during the etching. In at least some embodiments, the plasma etch chamber is configured to alternate curing and etching.

In at least some embodiments, the layer stack is a part of a multi-stacked structure on the substrate, and the plasma etch chamber is configured to repeat etching using the first mask, curing, slimming, and etching using the second mask until the substrate is exposed.

In at least some embodiments, the plasma etch chamber is configured to etch the layer stack comprising an insulating layer on a conducting layer. In at least some embodiments, the plasma etch chamber is configured to etch the layer stack comprising an oxide layer on a nitride layer. In at least some embodiments, the plasma etch chamber is configured to etch the layer stack comprising a first polymer layer a second polymer layer.

Other features of the present invention will he apparent from the accompanying drawings and from the detailed description which follows.

DETAILED DESCRIPTION

Figure 1:
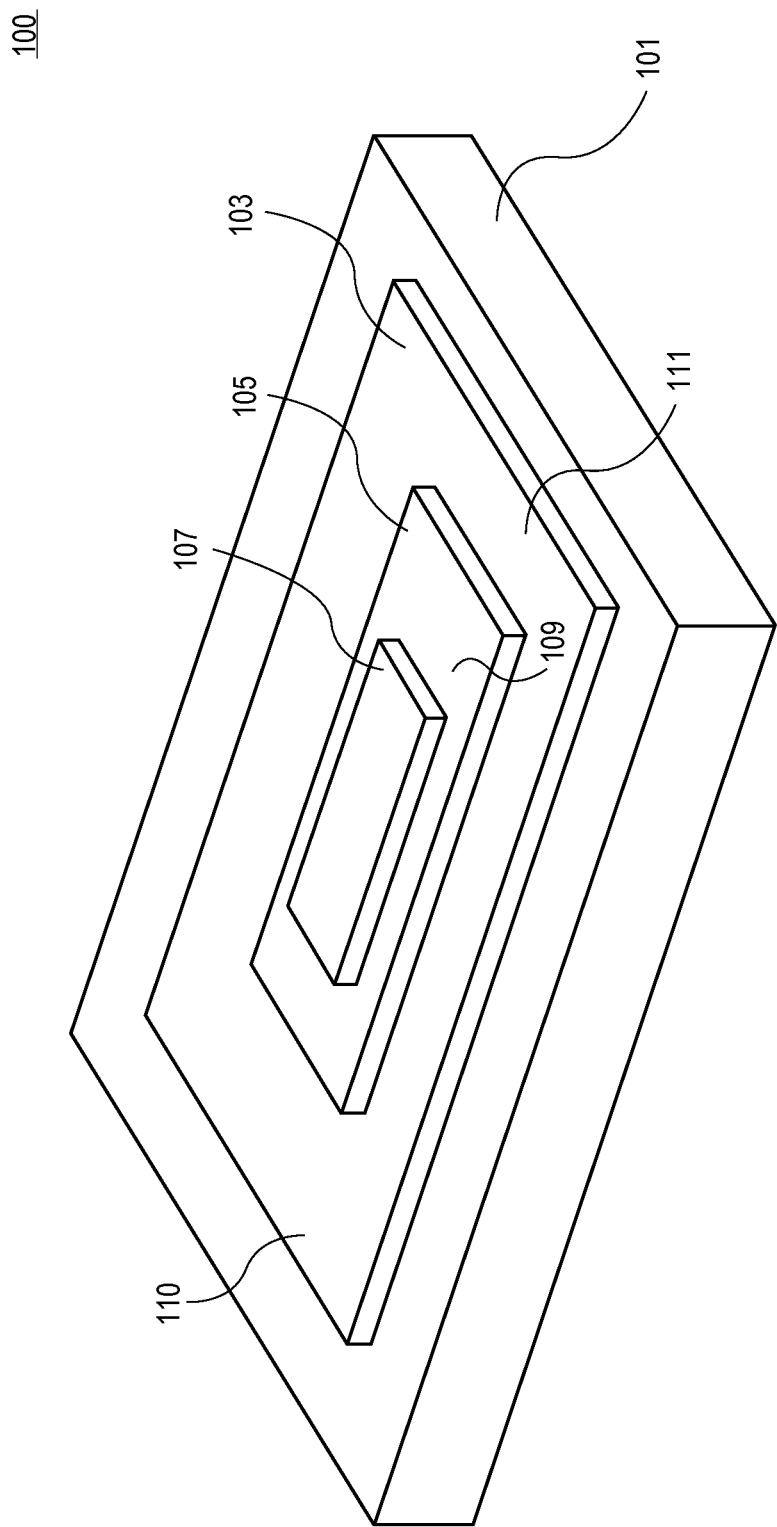
FIG. 1 is a perspective view of one embodiment of a wafer having a stacked structure over a substrate.

In the following description, numerous specific details, such as specific materials, chemistries, dimensions of the elements, etc. are set forth in order to provide thorough understanding of one or more of the embodiments of the present invention. It will be apparent, however, to one of ordinary skill in the art that the one or more embodiments of the present invention may he practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus be regarded as illustrative rather than limiting.

Methods and apparatuses to provide high L/V ratio etch semiconductor process architecture in plasma etch chamber for semiconductor device manufacturing are described herein. A layer stack over a substrate is etched using a photoresist ("PR") pattern deposited on the layer stack as a first mask. The PR pattern is in-situ cured using plasma. At least a portion of the PR pattern can be chemically modified by in-situ plasma curing. In at least some embodiments, a crust layer formed on a top portion of the PR pattern is hardened by in-situ plasma curing. In one embodiment, silicon by-products are formed on the PR pattern from the plasma to harden the crust layer. In another embodiment, a carbon from the plasma is embedded into the PR pattern to harden the crust layer. In at least some embodiments, the PR pattern is in-situ cured by a UV radiation generated by the plasma in a plasma etch chamber to chemically modify and harden the photoresist pattern. The cured photoresist pattern is slimmed. The layer stack is etched using the slimmed photoresist pattern as a second mask.

Methods and apparatuses described herein increase PR selectivity, increase L/V etching ratio, and decrease line edge roughness ("LER") of the photoresist pattern and the material underlying the photoresist pattern relative to existing methods and apparatuses. Increasing PR selectivity, L/V etching ratio, and decreasing LER of the photoresist pattern and the material underlying the photoresist pa tern can be crucial for manufacturing electronic devices having reduced (e nanometer scale) dimensions Methods described herein can be performed in a plasma etching system, for example, an Reactive Ion Etching ("RIE") system or an inductively coupled plasma ("ICP") etch system, without a need for a UV lamps curing chamber.

FIG. 1 is a perspective view of one embodiment of a wafer 100 having a multi-stacked structure 110 over a substrate 101. As shown in FIG. 1, the multi-stacked structure 110 has a number of steps. Substrate 101 can include a semiconductor, e.g., silicon, germanium, or any other semiconductor. In at least some embodiments, substrate 101 comprises any material to make any of integrated circuits, passive (e.g., capacitors, inductors) and active (e.g., transistors, photo detectors, lasers, diodes) microelectronic devices. Substrate 101 may include insulating (e.g., dielectric) materials that separate such active and passive microelectronic devices from a conducting layer or layers that are formed on top of them. In one embodiment, substrate 101 is a monocrystalline silicon ("Si") substrate that includes one or more dielectric layers e.g., silicon dioxide, silicon nitride, sapphire, and other dielectric materials.

Multi-stacked structure 110 has a layer stack 107 deposited on a layer stack 105 that is on layer stack 103. Each layer stack comprises one or more layers deposited over substrate 101 using one of techniques known to one of ordinary skill in the art of electronic device manufacturing. The one or more layers of the layer stack may be any of conducting, semiconducting, and insulating layers, as described in further detail below.

In FIG. 1, multi- stacked structure 110 has three layer stacks, but the present invention is not limited thereto. Although it is not shown, the multi-stacked structure may comprise, for example, 8, 16, 32, or any other number of layer stacks one embodiment, the thickness of the multi-stacked structure is from about 2 microns ("µm") to about 6 microns. As shown in. FIG. 1, multi-stacked structure 110 has steps, such as a step 109 and a step 111. In one embodiment, contacts (not shown) are formed on the steps of multi-stacked structure 110. Multi-stacked step structure 110 can be a part of a memory device, such as a three-dimensional ("3D") NAND flash memory chip.

Figure 2A:
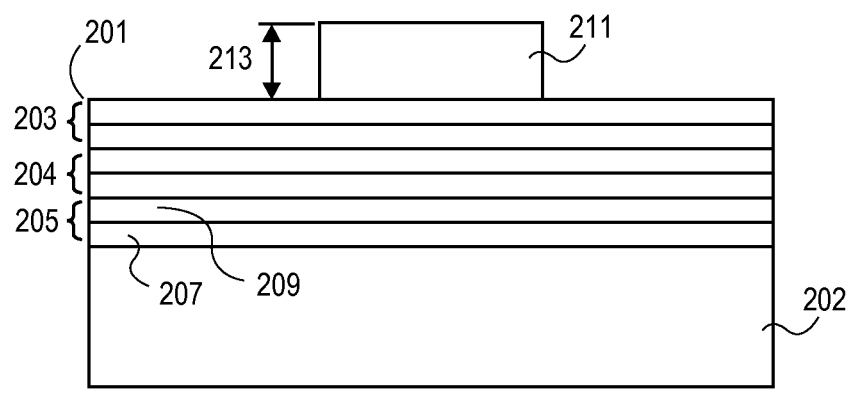
FIG. 2A is a c sectional view of an exemplary embodiment of a wafer having a multi-stacked structure over a substrate.

FIG. 2A is a cross-sectional view of an exemplary embodiment of a wafer 200 having a multi-stacked structure 201 over a substrate 202. Substrate 202 can be any of substrates as described with respect to FIG. 1. Multi-stacked structure 201 has a number of layer stacks, for example, layer stacks 203, 204, and 205, deposited on top of each other. Multi-stacked structure 201 can have 8, 16, 32, or any other number of layer stacks.

Layer stack 205 can be deposited on substrate 202 using one of techniques known to one of ordinary skill in the art of electronic device manufacturing. Layer stack 204 can be deposited on layer stack 205 using one of techniques known to one of ordinary skill in the art of electronic device manufacturing. Layer stack 203 can be deposited on layer stack 204 using one of techniques known to one of ordinary skill in the art of electronic device manufacturing. Each of the layer stacks can comprise one or more conducting, insulating, semiconducting, or any combination thereof layers. In one embodiment, each of the layer stacks includes at least two layers, such as a layer 207 and a layer 209.

In one embodiment, each of the layer stacks, such as layer stacks 203, 204, and 205, includes an insulating layer adjacent to (for example, on or underneath) a conducting layer. The insulating layer can be a layer of any dielectric material. The dielectric material can be, for example, an interlayer dielectric, an oxide (e.g., silicon oxide), nitride (e.g., silicon nitride), or a combination thereof. The conducting layer can be a layer of any conducting material. In one embodiment, the conducting material is polysilicon. In another embodiment, the conductive material is a metal, for example, copper (Cu), ruthenium (Ru), nickel (Ni), cobalt (Co), chromium (Cr), iron (Fe), manganese (Mn), titanium (Ti), aluminum (Al), hafnium (Hf, tantalum (Ta), tungsten (W), Vanadium (V), Molybdenum (Mo), palladium (Pd), gold (Au), silver (Au), platinum Pt, or any combination thereof. In at least some embodiments, the conducting material includes titanium nitride ("TiN"), tantalum nitride ("TaN"), or any combination thereof. In one embodiment, each of the layer stacks, such as layer stacks 203, 204, and 205, includes a layer of silicon oxide on a layer of polysilicon.

In one embodiment, each of the layer stacks, such as layer stacks 203, 204, and 205 includes an insulating layer adjacent to (for example, on or underneath) another insulating layer. One insulating layer can be an oxide, and another insulating layer can be a nitride. In one embodiment, each of the layer stacks, such as layer stacks 203, 204, and 205, includes a layer of silicon oxide on a layer of silicon nitride. In one embodiment, each of the layer stacks, such as layer stacks 203, 204, and 205, includes an oxide layer on a nitride layer on an oxide layer. In one embodiment, embodiment, each of the layer stacks, such as layer stacks 203, 204, and 205 includes one polysilicon layer over another polysilicon layer. These polysilicon layers may be separated by an interlayer dielectric, e.g., an oxide layer. In one embodiment, embodiment, each of the layer stacks, such as layer stacks 203, 204, and 205 includes a polysilicon layer on a nitride layer on an oxide layer.

In at least some embodiments, the thickness of each of the layers in the layer stack, such as layer stacks 203, 204 and 205, is froth about 50 nanometers to about 500 nanometers.

In one embodiment, layer stack 205 is deposited directly onto substrate 202. In another embodiment, an insulating layer, e.g., an oxide, nitride, or a combination thereof, can be deposited between layer stack 205 and substrate 202.

As shown in FIG. 2A, a photoresist ("PR") pattern 211 is formed on an upper layer stack 203. Depositing and patterning of the photoresist is known to one of ordinary skill in the art of electronic device manufacturing. In one embodiment, photoresist pattern 211 acts as a mask for etching underlying layer stack 203. In one embodiment, the thickness 213 of the PR is from about 1 µm to about 5 µm. In one embodiment, the thickness of the PR is from about 2 µm to about 3.5 µm.

In one embodiment, photoresist 211 is a positive tone photoresist. In another embodiment, photoresist 211 is a negative tone photoresist. In one embodiment, photoresist 211 is UV lithography photoresist. In one embodiment, photoresist 211 is an e photoresist. In one embodiment, photoresist 211 includes fluoropolymers. In another embodiment, photoresist 211 includes silicon-containing polymers. In one embodiment, photoresist 211 includes hydroxy styrene and/or acrylic acid monomers to provide acid groups when photoresist is exposed to radiation. Generally, the choice of the material for photoresist 211 depends on a particular microelectronic device processing application. In particular, the choice of the material for photoresist 211 depends on the properties of the photoresist at a given wavelength of radiation. In alternate embodiments, photoresist 211 is optimized to a wavelength of radiation, e.g., 365 nm, 248 nm, 193 nm, 157 nm, and 13 nm. In one embodiment, photoresist 211 is an ArF photoresist. In another embodiment, photoresist 211 is a KrF photoresist.

Figure 2B:
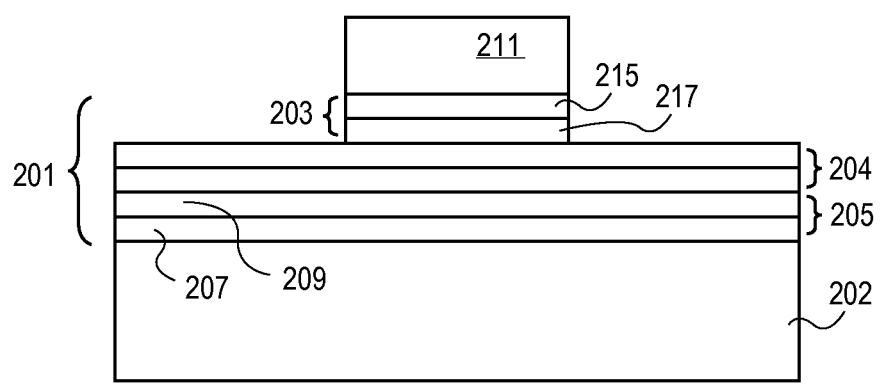
FIG. 2B is a view similar to FIG. 2A, after a layer stack is plasma etched using a photoresist pattern as a mask.

FIG. 2B is a similar to FIG. 2A, after layer stack 203 is plasma etched using a photoresist pattern 211 as a mask. As shown in FIG. 2B, each of the layer stacks contains at least two layers, such as layer 215 and 217. In one embodiment, each of the layers of the stack is selectively plasma etched using an appropriate plasma chemistry that selectively etches that layer. In case layer stack 203 contains an insulating layer adjacent to a conductive layer, the insulating layer and the conductive layer are etched by plasma having different chemistries. For example, the insulating layer can be selectively etched with an insulating layer etching plasma generated from a gas selected from the group consisting of $CF_4$, $CHF_3$ and $CH_2F_2$, $O_2$, or any combination thereof and a helium (He) gas or an argon (Ar) gas.

In case the conductive layer s formed of polysilicon, it is preferable to selectively etch the polysilicon layer with a silicon etch plasma. For example, the silicon etch plasma may be formed using a gas selected from the group consisting of HBr, $Cl_2$ and $O_2$, or any combination thereof.

In case layer stack 203 contains an oxide layer adjacent to a nitride layer, the oxide layer and the conductive layer can be etched with plasmas having different chemistries. For example, the oxide layer is preferably selectively etched with an oxide etching plasma formed using a gas selected from the group consisting of $C_4F_6$, $C_4F_8$, $CF_4$, or any combination thereof. For example, the nitride layer is preferably selectively etched with an nitride etching plasma formed using a gas selected from the group consisting of $CH_3F$, $CH_2F_2$, $CHF_3$, or any combination thereof.

In one embodiment, residues e.g., PR scum) formed during etching of the layer stack 203 are removed, for example, using a $CF_4$ gas or an $O_2$ gas using any of techniques known to one of ordinary skill of device manufacturing.

Figure 2C:
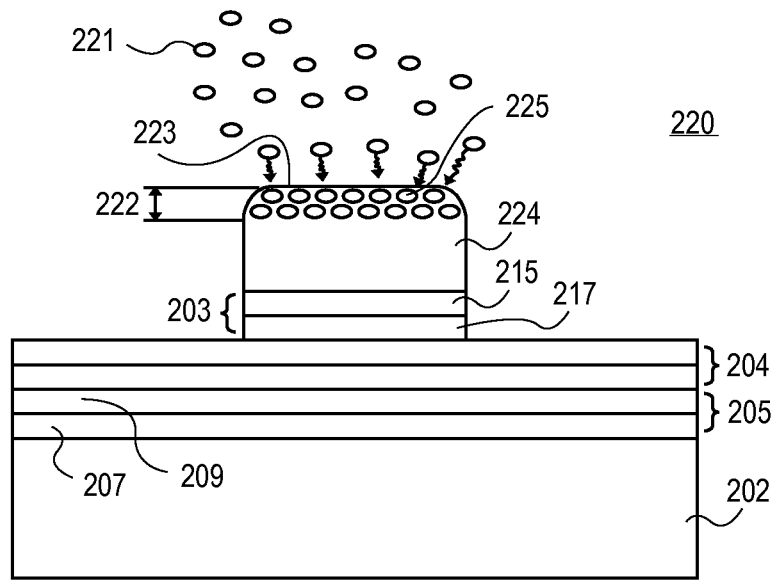
FIG. 2C is a view 220 similar to FIG. 2B showing an exemplary embodiment of in-situ curing of a photoresist pattern using plasma.

FIG. 2C is a view 220 similar to FIG. 2B showing an exemplary embodiment of in-situ curing of a photoresist pattern 224 using plasma. In one embodiment, plasma curing of the PR 224 is performed in the same etch chamber as plasma etching of the layer stack 203. In one embodiment, plasma curing involves chemically modifying at least a portion of the PR pattern 224. As shown in FIG. 2C, plasma curing 221 involves forming a hardened crust 223 at a top of the PR pattern. In one embodiment, top crust portion 223 is in-situ hardened by incorporating elements 225 produced by plasma 221. In one embodiment, plasma 221 is generated in an etch chamber from a process gas containing $SiCl_4$, $SiF_4$, $SiH_4$, $O_2$, $N_2$, or any combination thereof, and elements 225 produced from plasma 221 are silicon by-products. In one embodiment, top crust layer 223 contains the silicon by-products formed on the surface of the photoresist pattern. In one embodiment, a good uniformity of silicon by-products formed in the top crust layer 223 is achieved by controlling only a source power supplied to the plasma etch chamber.

In another embodiment, plasma 221 is generated in the etch chamber from a process gas containing $CH_4$, $CH_3F$, $CH_2F_2$, $CHF_3$, $CF_4$, $C_4F_6$, $C_4F_8$, $H_2$, or any combination thereof, and elements 225 produced from plasma 221 are carbons. In one embodiment, top crust layer 223 embeds the carbons from the plasma 221. In one embodiment, a good uniformity of carbons embedded into the top crust layer 223 is achieved by manipulating a bias power supplied to the plasma etch chamber. In one embodiment, the thickness 222 of the top crust layer is from about 50 nm to about 500 nm.

In one embodiment each of the silicon and carbon curing is performed more efficiently on a top of the photoresist than on the sides of the photoresist. In one embodiment, hardened crust layer 223 is formed only on the top of the photoresist. In one embodiment, the hardened crust layer not formed on the sidewalls of the photoresist. In one embodiment, carbon or silicon plasma curing of the photoresist is performed at a temperature of about 40° C.

Figure 3A:
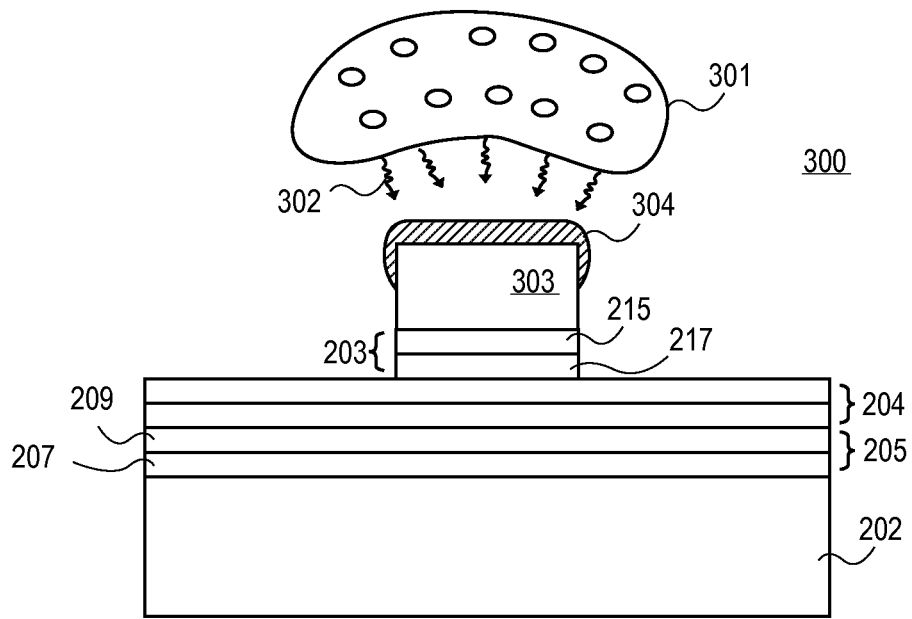
FIG. 3A is a view similar to FIG. 2B showing another exemplary embodiment of in-situ curing of a photoresist pattern using plasma.

FIG. 3A is a view 300 similar to FIG. 2B showing another exemplary embodiment of in-situ curing of a photoresist ("PR") pattern 303 using plasma. In one embodiment, curing of the PR pattern 303 is performed in the same etch chamber as plasma etching of the layer stack 203. In one embodiment, curing the PR 303 involves illuminating a surface of the PR 303 by a deep ultraviolet ("UV") light plasma emission 302 to chemically modify a top portion 304 of the PR pattern 303. As shown in FIG. 3A, a hardened top crust portion 304 is formed by a deep ultraviolet ("UV") light plasma emission 302.

Figure 5:
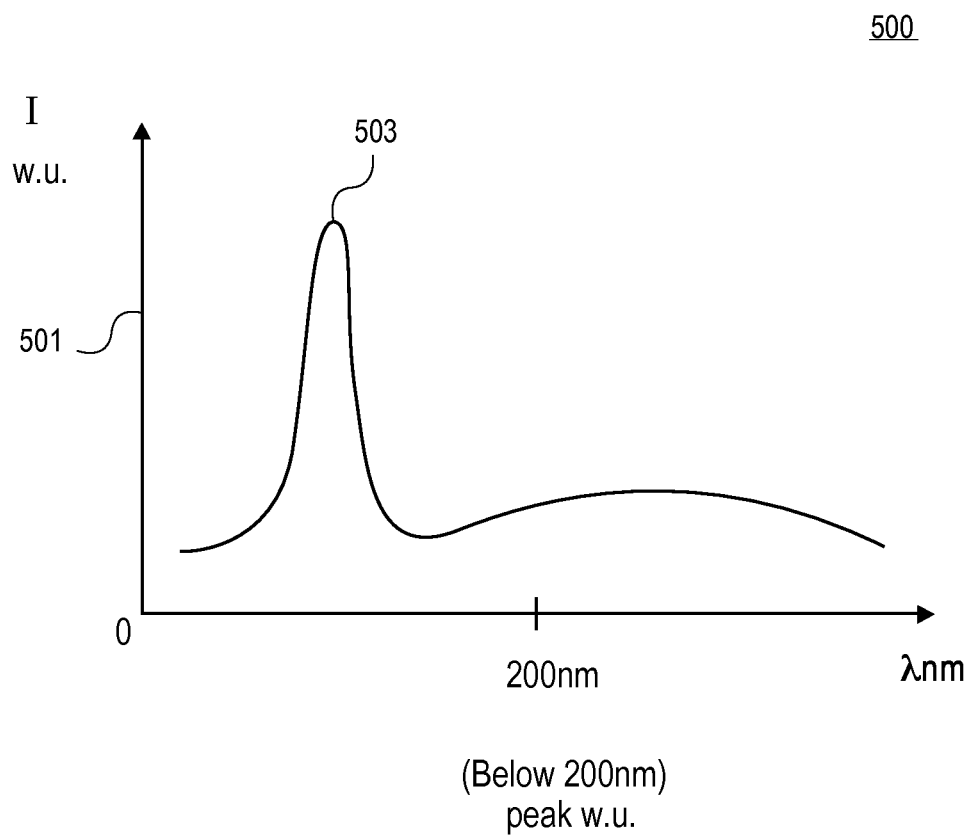
FIG. 5 is an exemplary graph illustrating a UV light plasma emission intensity versus a wavelength according to one embodiment of the invention.

FIG. 5 is an exemplary graph 500 illustrating a UV light plasma emission intensity ("I") versus a wavelength ("λ") 502 according one embodiment of the invention. As shown in FIG. 5, emission intensity of plasma 301 has a peak 503 at a wavelength below 200 nm. In one embodiment, a chemistry of the process gas in the etch chamber is configured to cause plasma 301 to emit UV light 302 at a wavelength below 200 nm.

In one embodiment, a process gas in the etch chamber that is configured to cause plasma 301 to emit UV light 302 at a wavelength below 200 nm contains $H_2$, $C_4F_6$, $C_4F_8$, $SF_6$, $O_2$, $CF_4$, $SO_22$, HBr, $CF_6$, Ar, or any combination thereof. In one embodiment, the UV light plasma emission cure uniformity is optimized by adjusting a DC power provided to the plasma etch chamber. In one embodiment, In one embodiment, a high voltage is supplied to the etch chamber to cause the UV light plasma emission. In one embodiment, a pressure supplied to etch chamber to perform UV light plasma emission curing of the photoresist is from about 2 milliTorr ("mT") to about 6 mT. In one embodiment, a pressure supplied to etch chamber to perform UV light plasma emission curing of the photoresist is about 4 mT. In one embodiment, UV light plasma emission curing of the photoresist is performed at a temperature of about 80° C.

In one embodiment, the thickness of the top crust layer 304 is from about 50 nm to about 500 nm. In one embodiment, UV light plasma emission curing is performed substantially more efficiently on a top than on the sides of the photoresist. In one embodiment, hardened crust layer 304 is formed only on the top of the photoresist. In one embodiment, the hardened crust layer is not formed on the sidewalls of the photoresist.

In one embodiment, curing of the photoresist pattern using the plasma as described, for example, with respect to FIGS. 2C or 3A, is performed simultaneously with etching, as described, for example, with respect to FIG. 2B. In one embodiment, curing of the photoresist pattern using the plasma as described for example, with respect to FIGS. 2C or 3A, and etching, as described, for example, with respect to FIG. 2B repeatedly alternate. In one embodiment, curing of the photoresist pattern using the plasma as described for example, with respect to FIGS. 2C or 3A is performed for about 20 to 40 seconds.

Figure 2D:
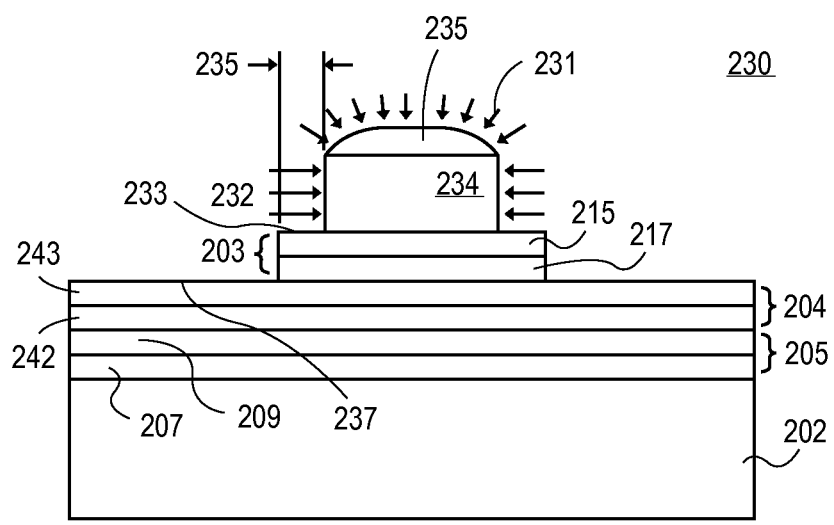
FIG. 2D is a view similar to FIG. 2C or FIG. 3A, showing an exemplary embodiment of trimming of a cured photoresist pattern.

FIG. 2D is a view 230 similar to FIG. 2C or FIG. 3A, showing an exemplary embodiment of trimming ("slimming") of a cured photoresist pattern 234. In one embodiment, the slimming involves reducing the size of the photoresist pattern in a lateral direction 232 while substantially preserving the size of the photoresist pattern in a vertical direction 231. As shown n FIG. 2D, a hardened top crust layer 235 makes an etch rate of the photoresist vertical direction 231 ("vertical etch rate") substantially smaller than in lateral direction 232 ("lateral etch rate"). In one embodiment, a lateral to vertical ("L/V") etch rate of the plasma cured photoresist as described herein is at least about 2. In one embodiment, a L/V etch rate of the plasma cured photoresist as described herein is from about 1.5 to about 20.

In one embodiment, a portion 233 of the layer stack 203 is exposed by slimming of the PR 234. In one embodiment, in-situ slimming of the photoresist involves plasma etching of the PR using a process gas containing He and $O_2$, or He, $O_2$ and $N_2$. In one embodiment, slimming of the photoresist is performed at a pressure from about 20 mTorr to about 100 mTorr and with a source power from about 1,000 Watts ("W") to about 1,800 W. In one embodiment, a bias power is not supplied to the etch chamber to minimize the loss of the photoresist pattern. A slimming width of the photoresist pattern can be changed based on a slimming processing time, a desired width can be achieved by adjusting the processing time. In one embodiment, the photoresist can be slimmed down to the width of about 7-10 nm.

In one embodiment, slimming of the photoresist is performed for about 40 seconds to about 80 seconds.

In one embodiment, a size 235 of the exposed portion 233 is from about 200 nm to about 600 nm.

Figure 2E:
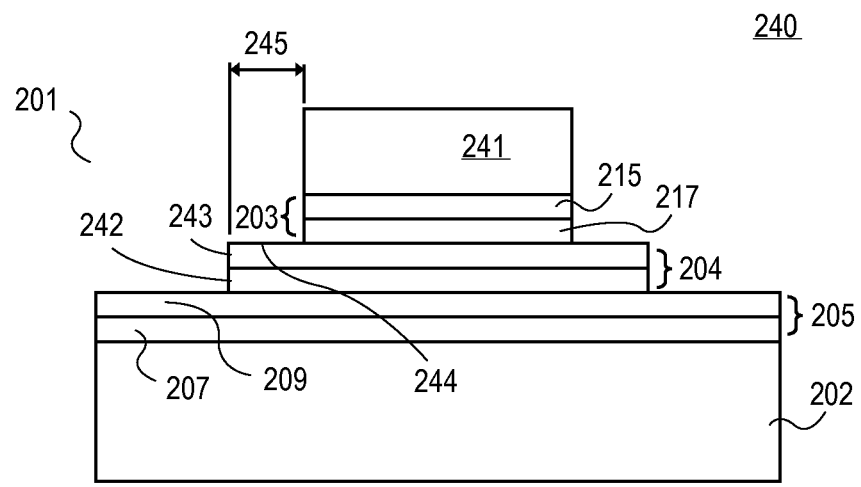
FIG. 2E is a view 240 similar to FIG. 2D after underlying layer stacks, are etched using a slimmed photoresist pattern as a mask.

FIG. 2E is a view 240 similar to FIG. 2D after underlying layer stacks, such as layer stacks 203 and 204 are etched using a slimmed photoresist pattern 241 as a mask. In one embodiment, exposed portions of corresponding layers of layer stack 204, such as portion 237 in FIG. 2D, are selectively etched at the same time as exposed portions of the corresponding layers of etched layer stack 203, such as a portion 233, are etched. As shown in FIG. 2D, layer stack 203 includes layers 215 and 217, and layer stack 204 includes layers 243 and 242. In one embodiment, if layers 243 and 215 are formed of a first material, exposed portions of the layer 243, such as portion 237, are etched at the same time with the exposed portions of layer 215, such as portion 233, by a first plasma chemistry. In one embodiment, if layers 217 and 242 are of a second material, exposed portions of the layer 242 are etched at the same time with the exposed portions of the layer 217 by a second plasma chemistry that is different from the first plasma chemistry. Selective etching of the layers by different plasma chemistries is described above with respect to FIG. 2B.

As shown in FIG. 2E, stack 204 is etched to the substantially the same width as stack 203 is etched to in FIG. 2B using patterned photoresist 211 as a mask. As shown in FIG. 2E, plasma etching of the stacks 203 and 204 using the slimmed photoresist 241 as a mask exposes portions of stack 204, such as a portion 244. In one embodiment, size 245 of the portion 244 is from about 200 nm to about 600 nm.

In one embodiment, residues (e.g., PR scum) formed during etching of the layer stack 203 are removed, for example, using a CF$_4$ gas or an O$_2$ gas using any of techniques known to one of ordinary skill of device manufacturing.

Figure 2F:
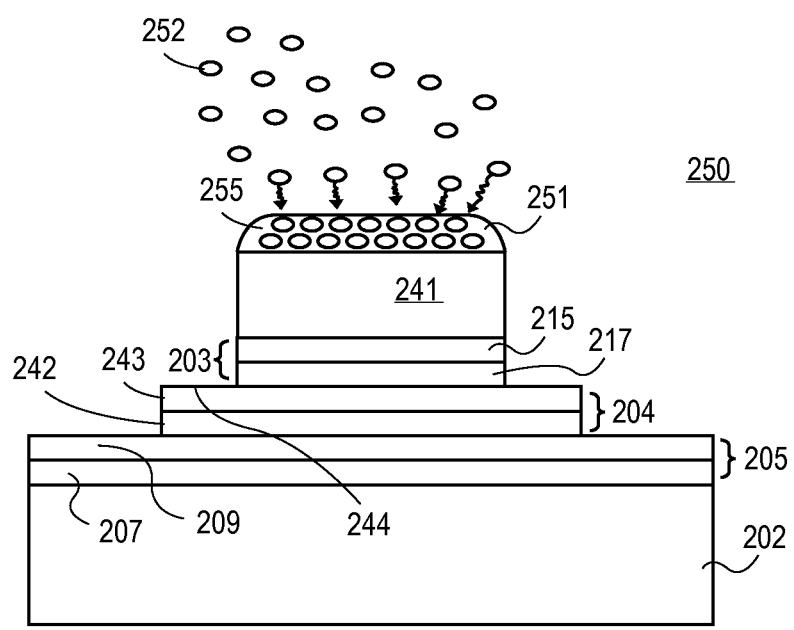
FIG. 2F is a view similar to FIG. 2E illustrating an exemplary embodiment of in-situ plasma curing of a slimmed photoresist pattern.

FIG. 2F is a view 250 similar to FIG. 2E illustrating an exemplary embodiment of in-situ plasma curing 252 of a slimmed photoresist pattern 241. In one embodiment, plasma curing of the slimmed photoresist pattern 241 is performed in the same etch chamber as plasma etching of the layer stacks 203 and 204. In one embodiment, plasma curing involves chemically modifying at least a portion of the PR pattern 241, as described above with respect to FIG. 2C.

As shown in FIG. 2F, plasma curing 252 involves forming a hardened crust 255 at a top of the PR pattern. In one embodiment, top crust portion 255 is in-situ hardened by incorporating elements 251 produced by plasma 252, as described above with respect to FIG. 2C.

Figure 3B:
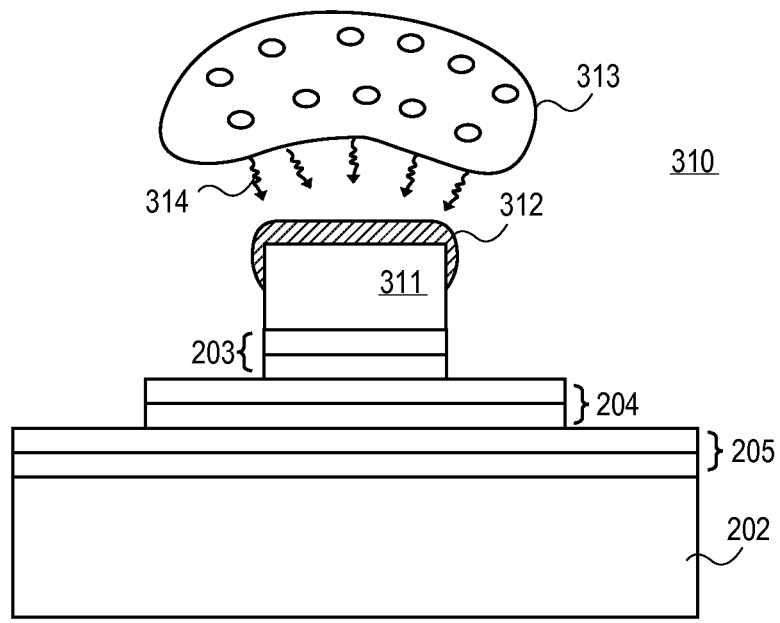
FIG. 3B is a view similar to FIG. 2E showing another exemplary embodiment of in-situ curing of a slimmed photoresist pattern using plasma.

FIG. 3B is a view 310 similar to FIG. 2E showing another exemplary embodiment of in-situ curing of a slimmed photoresist ("PR") pattern 311 using plasma. In one embodiment, curing of the PR pattern 311 is performed in the same etch chamber as plasma etching of the layer stacks 203 and 204. In one embodiment, curing the PR 311 involves illuminating a surface of the photoresist by a deep ultraviolet ("UV") light plasma emission 314 to chemically modify a top portion 312 of the photoresist pattern, as described above with respect to FIG. 3A.

Figure 2G:
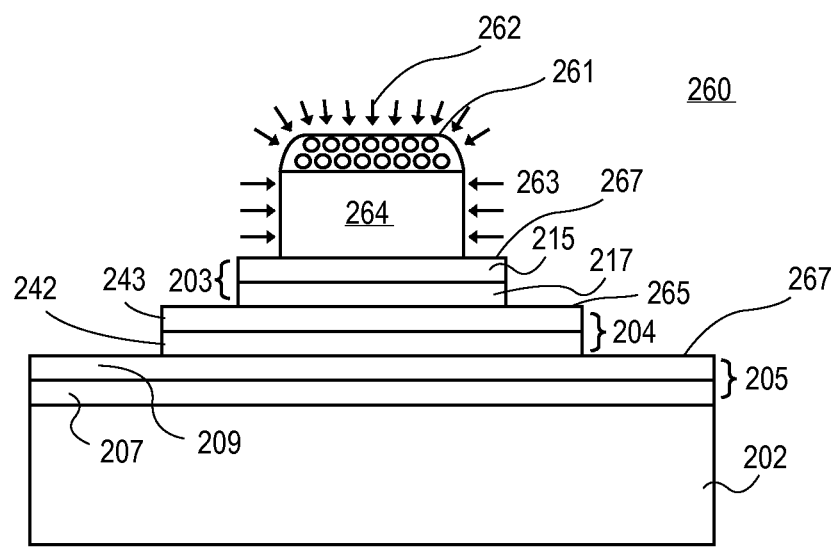
FIG. 2G is a view similar to FIG. 2F or FIG. 3B, showing one exemplary embodiment of slimming of a cured photoresist pattern.

FIG. 2G is a view 260 similar to FIG. 2F or FIG. 3B, showing one exemplary embodiment of slimming of a cured photoresist pattern 264. In one embodiment, the slimming involves reducing the size of the photoresist pattern 264 in a lateral direction 232 while substantially preserving the size of the photoresist pattern in a vertical direction 231, as described above with respect to FIG. 2D. In one embodiment, a portion of the layer stack 203 is exposed by slimming of the PR 241. In one embodiment, the size of the exposed portion of the layer stack 203 is from about 200 nm to about 600 nm.

Figure 2H:
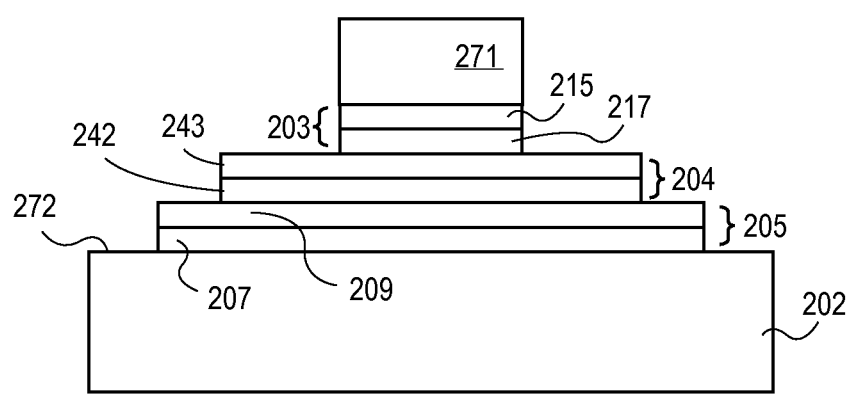
FIG. 2H is a view similar to FIG. 2G after underlying layer stacks are etched using a slimmed photoresist pattern as a mask.

FIG. 2H is a view 270 similar to FIG. 2G after underlying layer stacks, such as layer stacks 203, 204, and 205 are etched using a slimmed photoresist pattern 271 as a mask. In one embodiment, exposed portions of corresponding layers of layer stacks 204 and 205, such as portions 265 and 267 in FIG. 2G are selectively etched at the same time as the exposed portions of corresponding layers of etched layer stack 203, such as a portion 267, are etched. In one embodiment, if layers 209, 243 and 215 are formed of a first material, the exposed portions of the layer 243 and 209 are etched at the same time with the exposed portion of layer 215 by a firs plasma chemistry. In one embodiment, if layers 207, 217 and 242 are of a second material, exposed portions of the layers 242 and 207 are etched at the same time with exposed portions of the layer 217 by a second plasma chemistry that is different from the first plasma chemistry. Selective etching of the layers by different plasma chemistries is described above with respect to FIGS. 2B and 2E.

As shown in FIG. 2H, stack 205 is etched to the substantially the same width as stack 203 is etched to in FIG. 2B using patterned photoresist 211 as a mask, and as stack 204 is etched to in FIG. 2E using slimmed photoresist pattern 241 and stack 203 as a mask. As shown in FIG. 2H, plasma etching of the stacks 203, 204, and 205 using the slimmed photoresist 271 as a mask exposes portions of substrate 202, such as a portion 272. In one embodiment, for the multi-stacked structure on the substrate, etching using the photoresist as a first mask, plasma curing, plasma slimming and etching using the slimmed photoresist as a second mask are repeated until at least a portion of the substrate is exposed, as described above. In one embodiment, the photoresist 271 is removed from the stack 203 to provide, for example, a multi-step structure, as described in FIG. 1. The photoresist can be removed using one of techniques known to one of ordinary skill in the an of semiconductor manufacturing.

Figure 4:
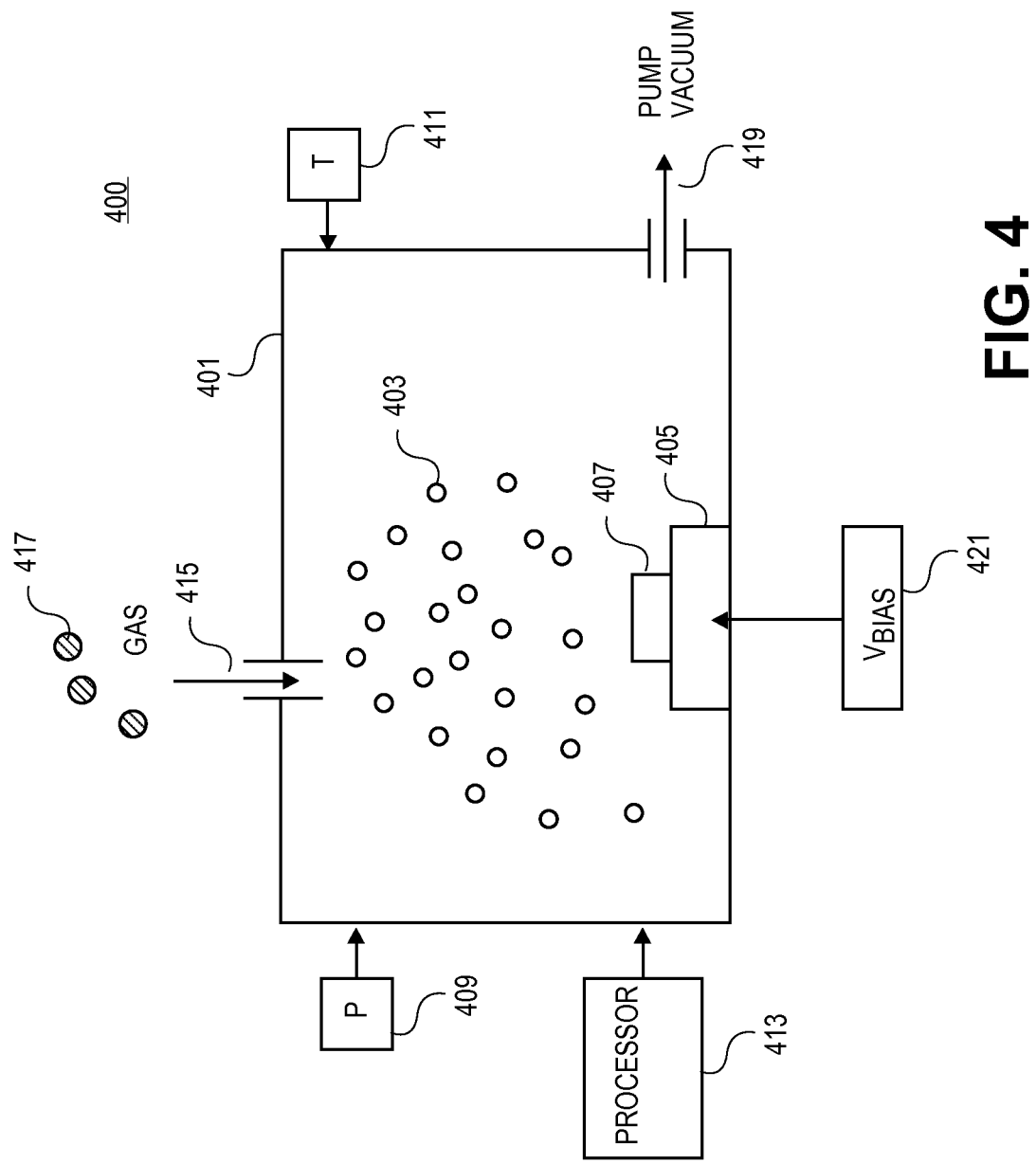
FIG. 4 shows a block diagram of one embodiment of a plasma etching system to perform one or more methods described herein.

FIG. 4 shows a block diagram of one embodiment of a plasma etching system 400 to perform one or more methods described herein. As shown in FIG. 4, system 400 has an etch chamber 401 containing plasma 403 to etch a wafer 407 on a stage 405. Generally, plasma 403 contains atoms, molecular radicals and positive ions that are more chemically reactive than the normal molecular gases from which the species are created. Plasma 403 is generated under a pressure (vacuum) by an electromagnetic field. Typically, to etch wafer 407, high-energy ions from the plasma 403 attack the surface of wafer 907 and react with it.

Etch chamber 401 has a gas inlet 415 to receive a process gas 417, as described above. In at least some embodiments, the process gas 417 is configured to one or more etch layers, as described herein for example, with respect to FIGS. 2B, 2E, 2H. In at least some embodiments, the process gas 417 is configured to cure a photoresist, as described herein for example, with respect to FIGS. 2C, 2F, 3A, or 3B. In at least some embodiments, the process gas 417 is configured to slim a photoresist, as described herein for example, with respect to FIGS. 2D, or 2G. In at least some embodiments, plasma 403 is produced from the process gas 417 using a high frequency electric field. As shown in FIG. 4, a pressure control system 409 provides a pressure to etch chamber 401, a temperature control system 411 controls a temperature in the etch chamber 401, and bias power source 421 provides a bias voltage to stage 405 on which wafer 405 is placed.

In at least some embodiments, etch chamber 401 is coupled to a RF source power (not shown), and to two RF bias powers (not shown) to produce plasma 403. Typically, at least one RF bias is applied to stage 405 to create directional electric fields near the wafer to achieve more anisotropic etch profiles. As shown in FIG. 4, system 400 includes a processor 413 is coupled to etch chamber 401 to perform one or more methods, as described herein.

Etch chamber 401 has an outlet 419 connected to a vacuum pump system (not shown) to evacuate the air including volatile compounds produced during plasma etching, plasma curing, or plasma slimming, as described herein.

In at least some embodiments, plasma etching system 400 is a Reactive Ion Etching ("RIE") system. In at least o embodiments, plasma etching system 400 is an inductively coupled plasma ("ICP") etch system. The plasma etching system 400 can be, for example, a Poly Etch System, such as DPS, DPSII, AdvantEdge, G3, G5, G5 MESA systems produced by Applied Materials, Inc. located in Santa Clara, Calif., or other plasma etching systems.

Figure 6:
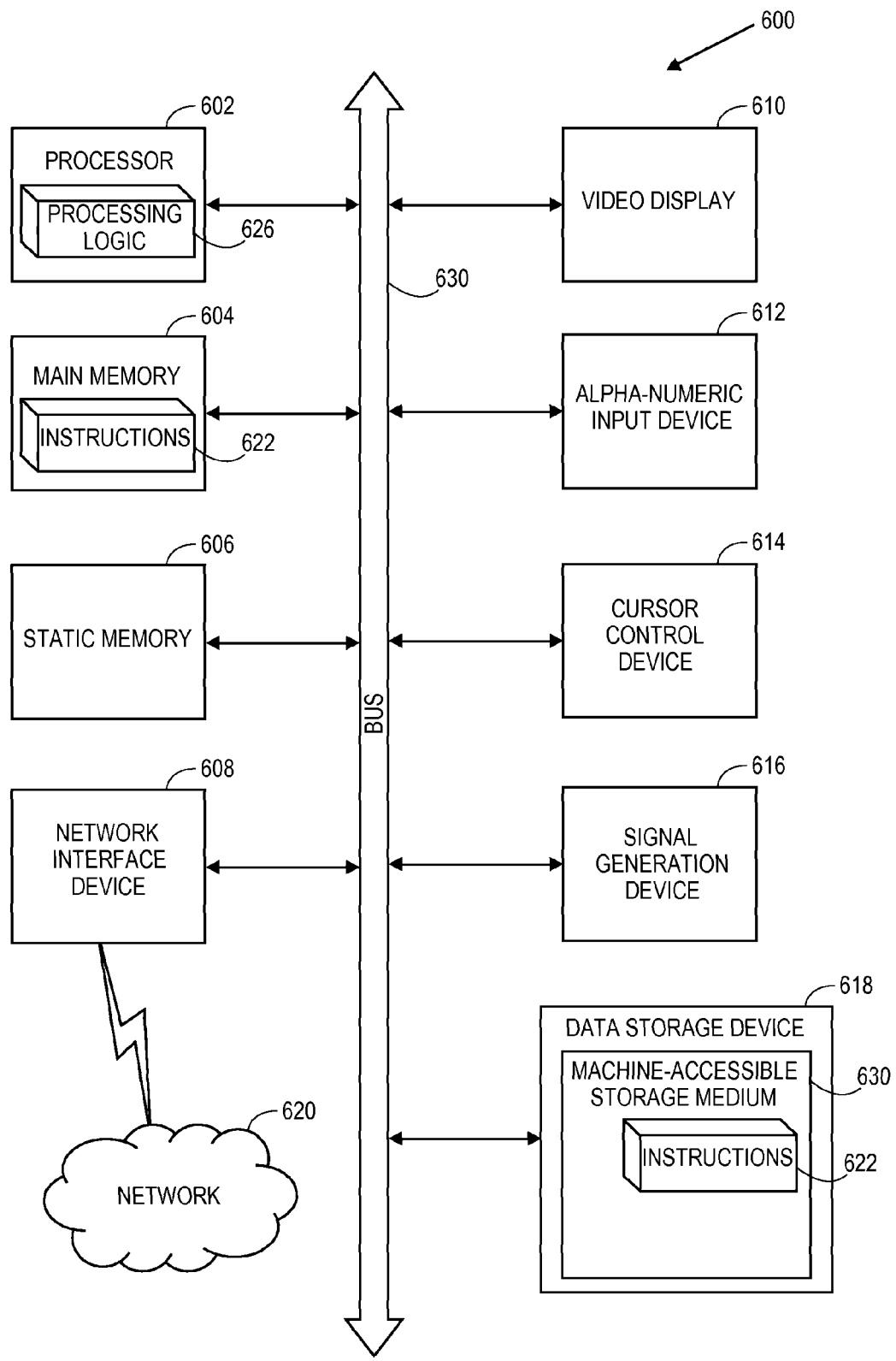
FIG. 6 shows a block diagram of an exemplary embodiment of a data processing system to control a plasma etching system to perform any one or more of the methods described herein.

FIG. 6 shows a block diagram of an exemplary embodiment of a data processing system 600 to control a plasma etching system to perform any one or more of the methods described herein. The plasma etching system, for example, plasma etching system 400, can be connected to a data processing system, for example, data processing system 600. In at least some embodiments, the data processing system controls the plasma etching system to perform operations involving etching a layer stack over a substrate using a photoresist pattern deposited on the layer stack as a mask, curing the photoresist pattern using plasma, slimming the cured photoresist pattern; and etching the layer stack using the slimmed photoresist pattern as a second mask, as described herein.

In alternative embodiments, the data processing system may be connected (e.g., networked) to other machines in a Local Area Network (LAN), an intranet, an extranet, or the Internet. The data processing system may operate in the capacity of a server or a client machine in a client-server network environment, or as a peer machine in a peer-to-peer (or distributed) network environment. The data processing system may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that data processing system. Further, while only a single data processing system is illustrated, the term "data processing system" shall also be taken to include any collection of data processing systems that individually or jointly execute a set (or multiple sets) of instructions to perform any one or more of the methodologies described herein.

The exemplary data processing system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A method to manufacture an electronic device, the method comprising:
   etching a first layer stack over a substrate using a photoresist pattern deposited on the first layer stack as a first mask;
   curing the photoresist pattern on the etched first layer stack using plasma, wherein a hardened crust layer is formed on a top of the photoresist pattern by curing;
   slimming the cured photoresist pattern having the hardened crust layer on the top to expose the etched first layer stack; and
   etching the exposed first layer stack using the slimmed photoresist pattern as a second mask.

2. The method of claim 1, wherein the hardened crust layer includes silicon by-products produced from the plasma.

3. The method of claim 1, wherein the hardened crust layer includes carbon produced from the plasma.

4. The method of claim 1, wherein hardened crust layer is formed by an ultraviolet light emitted from the plasma.

5. The method of claim 1, wherein the curing is performed during the etching.

6. The method of claim 1, wherein the curing and the etching alternate.

7. The method of claim 1, wherein the hardened crust layer includes elements produced by the plasma.

8. The method of claim 1, wherein the layer stack is a part of a multi-stacked structure on the substrate, and wherein the etching using the first mask, the curing, the slimming, and the etching using the second mask are repeated until the substrate is exposed.

9. The method of claim 1, wherein the layer stack comprises an insulating layer on a conducting layer.

10. The method of claim 1, wherein the layer stack comprises an oxide layer on an nitride layer.

11. The method of claim 1, wherein the layer stack comprises a first polymer layer on a second polymer layer.

12. The method of claim 1, wherein the plasma is generated at least from a gas selected from a group consisting of $CH_4$, $CH_3F$, $CH_2F_2$, $CHF_3$, $CF_4$, $C4F_6$, $C_4F_8$, $H_2$, or any combination thereof.

13. The method of claim 1, wherein the plasma is generated at least from a gas selected from a group consisting of $SiCl_4$, $SiF_4$, $SiH_4$, $O_2$, $N_2$, or any combination thereof.

14. The method of claim 1, wherein the plasma is generated at least from a gas selected from a group consisting of $H_2$, $C_4F_6$, $C_{4F8}$, $SF_6$, $O_2$, $CF_4$, $SO_2$, or any combination thereof.

* * * * *

UNITED STATES PATENT AND TRADEMARK OFFICE
CERTIFICATE OF CORRECTION

PATENT NO. : 8,529,776 B2  Page 1 of 1
APPLICATION NO. : 13/190378
DATED : September 10, 2013
INVENTOR(S) : Kyeong Tae Lee et al.

It is certified that error appears in the above-identified patent and that said Letters Patent is hereby corrected as shown below:

In the Specification

In column 3 at line 5 after "stacks" delete ","

In column 4 at line 34 delete "pa tern" and insert --pattern--

In column 6 at line 61 delete "an" and insert --a--

In column 7 at line 62 after "chamber." delete "In one embodiment,"

In column 10 at line 34 delete "one or more etch layers" and insert --etch one or more layers--

In the Claims

In column 12 claim 4 at line 49 after "wherein" insert --the--

In column 12 claim 10 at line 65 delete "an" and insert --a--

In column 13 claim 13 at line 3 delete "C4F$_6$" and insert --C$_4$F$_6$--

Signed and Sealed this
Twenty-ninth Day of October, 2013

Teresa Stanek Rea
*Deputy Director of the United States Patent and Trademark Office*